US010483445B2

(12) United States Patent
Kato

(10) Patent No.: US 10,483,445 B2
(45) Date of Patent: Nov. 19, 2019

(54) LEAD FRAME, PACKAGE FOR LIGHT EMITTING DEVICE, LIGHT EMITTING DEVICE, AND METHOD FOR MANUFACTURING LIGHT EMITTING DEVICE

(71) Applicant: NICHIA CORPORATION, Anan-shi, Tokushima (JP)

(72) Inventor: Yasuo Kato, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/043,364

(22) Filed: Jul. 24, 2018

(65) Prior Publication Data

US 2019/0067541 A1    Feb. 28, 2019

(30) Foreign Application Priority Data

Aug. 31, 2017  (JP) .................................. 2017-167304
Jul. 17, 2018  (JP) .................................. 2018-134266

(51) Int. Cl.
*H01L 33/62* (2010.01)
*H01L 33/48* (2010.01)
(Continued)

(52) U.S. Cl.
CPC ............... *H01L 33/62* (2013.01); *C25D 3/46* (2013.01); *C25D 5/10* (2013.01); *H01L 33/486* (2013.01);
(Continued)

(58) Field of Classification Search
CPC ....... H01L 33/62; H01L 33/60; H01L 33/486; H01L 2933/0033; H01L 2933/0058; H01L 2933/0066; C25D 3/46; C25D 5/10
See application file for complete search history.

(56) References Cited

U.S. PATENT DOCUMENTS

2008/0083973 A1    4/2008   Yamada et al.
2011/0012159 A1*   1/2011   Yamada .................. H01L 33/60
                                                           257/98
(Continued)

FOREIGN PATENT DOCUMENTS

JP        S61-148883 A    7/1986
JP        2002-094130 A   3/2002
(Continued)

*Primary Examiner* — Sitaramarao S Yechuri
(74) *Attorney, Agent, or Firm* — Global IP Counselors, LLP

(57) ABSTRACT

A lead frame includes a base material and two or more silver-containing layers. The base material is composed of a metal. The two or more silver-containing layers are stacked on the base material. The two or more silver-containing layers includes an uppermost silver-containing layer containing sulfur, and a lower silver-containing layer. The lower silver-containing layer contains no selenium or the lower silver-containing layer is composed substantially only of silver. A method for manufacturing a light emitting device includes: preparing a lead frame; preparing a package including the lead frame; and mounting a light emitting element on the package. The lead frame is prepared by: providing a base material; forming an underlying metal on the base material by plating to form an underlayer; and forming two or more silver-containing stacked layers on the underlayer, the two or more silver-containing stacked layers including an uppermost silver-containing layer containing sulfur.

13 Claims, 9 Drawing Sheets

(51) Int. Cl.
*H01L 33/60* (2010.01)
*C25D 5/10* (2006.01)
*C25D 3/46* (2006.01)

(52) U.S. Cl.
CPC ...... *H01L 33/60* (2013.01); *H01L 2933/0033* (2013.01); *H01L 2933/0058* (2013.01); *H01L 2933/0066* (2013.01)

(56) References Cited

U.S. PATENT DOCUMENTS

| | | | | |
|---|---|---|---|---|
| 2012/0313131 | A1* | 12/2012 | Oda | H01L 23/49503 257/98 |
| 2014/0264426 | A1* | 9/2014 | Yamashita | H01L 23/495 257/99 |
| 2015/0325763 | A1* | 11/2015 | Oda | H01L 23/49503 257/99 |
| 2016/0204321 | A1 | 7/2016 | Naka et al. | |

FOREIGN PATENT DOCUMENTS

| | | |
|---|---|---|
| JP | 2008-091818 A | 4/2008 |
| JP | 2010-199166 A | 9/2010 |
| JP | 2012-028626 A | 2/2012 |
| JP | 2012-028630 A | 2/2012 |
| JP | 2014-099496 A | 5/2014 |
| JP | 2014-179458 A | 9/2014 |
| JP | 2015-103615 A | 6/2015 |
| JP | 2016-122828 A | 7/2016 |
| WO | 2010038451 A | 4/2010 |

\* cited by examiner

LEAD FRAME, PACKAGE FOR LIGHT EMITTING DEVICE, LIGHT EMITTING DEVICE, AND METHOD FOR MANUFACTURING LIGHT EMITTING DEVICE

CROSS-REFERENCE TO RELATED APPLICATION

This application claims priority to Japanese Patent Application Nos. 2017-167304, filed on Aug. 31, 2017, and 2018-134266, filed on Jul. 17, 2018 the disclosure of which is hereby incorporated by reference in its entirety.

BACKGROUND

The present disclosure relates to a lead frame, a package for light emitting device, a light emitting device, and a method for manufacturing light emitting device.

Many packages whose surface is provided with silver (Ag), which has high reflectance of the light from a light emitting element, are employed in a light emitting device that makes use of a semiconductor light emitting element (hereinafter also referred to simply as a "light emitting element"). (for example, Japanese Unexamined Patent Application Publications No. 2002-094130, No. S61-148883, No. 2010-199166 and No. 2014-99496).

SUMMARY

With the conventional light emitting devices, an increase in light extraction efficiency is achieved by utilizing a partially or totally stacked silver plating layer, by adjusting the composition, glossiness, etc., of the silver plating layer by means of a stacked structure, or some other such method.

However, at present we have yet to reach a satisfactory level of improvement in light extraction efficiency.

Certain embodiment of the present disclosure has an object to provide a lead frame and a package for a light emitting device with which light extraction efficiency can be further improved, as well as such a light emitting device and a method of manufacturing this light emitting device.

A lead frame according to an embodiment of the present disclosure includes a base material and two or more silver-containing layers. The base material is composed of a metal. The two or more silver-containing layers are stacked on the base material. The two or more silver-containing layers includes an uppermost silver-containing layer containing sulfur, and a lower silver-containing layer. The lower silver-containing layer contains no selenium or the lower silver-containing layer is composed substantially only of silver.

A package according to an embodiment of the present disclosure includes a substrate in which the lead frame according to the above embodiment is embedded with at least a part of the uppermost silver-containing layer being exposed.

A light emitting device according to an embodiment of the present disclosure includes the package according to the above; and a light emitting element mounted on an upper surface of the uppermost silver-containing layer of the package.

A method for manufacturing a light emitting device according to an embodiment of the present disclosure includes: preparing a lead frame; preparing a package including the lead frame; and mounting a light emitting element on the package. The lead frame is prepared by: providing a base material; forming an underlying metal on the base material by plating to form an underlayer; and forming two or more silver-containing stacked layers on the underlayer, the two or more silver-containing stacked layers including an uppermost silver-containing layer containing sulfur.

Certain embodiment of the present disclosure can provide a lead frame and a package for a light emitting device with which light extraction efficiency can be further improved. Also provided are a light emitting device with which light takeoff efficiency is improved by using this lead frame or package, as well as a method of manufacturing this light emitting device.

DETAILED DESCRIPTION OF EMBODIMENTS

Figure 1A:
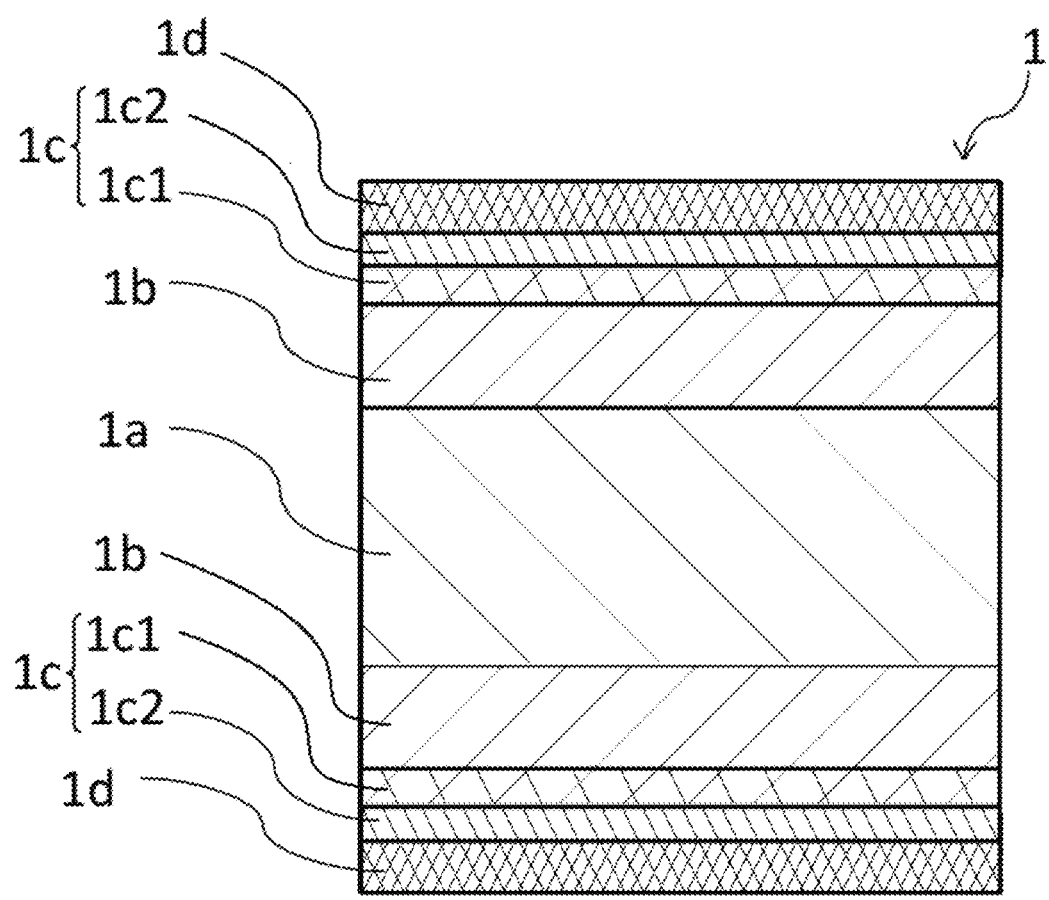
FIG. 1A is a partial enlarged schematic cross sectional view illustrating an embodiment of a lead frame.

The lead frames, packages for light emitting device, light emitting devices, and methods for manufacturing light emitting device to be described below are intended to embody the technical concept of the present invention and do not limit the present invention to the devices below. It is noted that there is a case where magnitudes or positional relations of members illustrated in the drawings are exaggerated in order to clarify the descriptions.

Embodiment 1: Lead Frame

The lead frame in this embodiment is constituted by a base material and two or more specific silver-containing layers stacked on the base material, that is, an uppermost silver-containing layer contains sulfur, and a lower silver-containing layer does not contain selenium or the lower silver-containing layer is composed substantially only of silver. As used herein, "being composed substantially only of silver" means a lower silver-containing layer is composed of silver and does not contain anything (i.e., any substances) other than inevitable impurities.

Electroplating is preferable as a method for efficiently producing the silver-containing layer. In case that a silver-containing layer that contains sulfur is produced by electroplating, in addition to a silver metal complex, small amounts of various organic sulfur compounds are added to the electroplating solution that is used, in order to make the surface of the silver-containing layer smoother and to have a surface with high light reflectance. The silver-containing layer deposited by electroplating from a silver plating solution to which an organic sulfur compound has thus been added yields smooth deposited crystal grains having high reflectance, but a tiny amount of organic sulfur component ends up being contained during plating. The sulfur referred to here is considered to be organic sulfur, and is generally different from the silver sulfide that is produced when silver reacts with hydrogen sulfide in the air to form silver sulfide (I), and which is known to cause blackening.

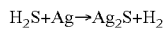
$H_2S + Ag \rightarrow Ag_2S + H_2$

Therefore, in case where a tiny amount of sulfur is present in the silver-containing layer, it will not accelerate the decrease in reflectance caused by blackening, as silver sulfide does.

When silver plating is performed on the surface of the base material of the lead frame, since the reflectance is greatly diminished in case where the silver turns black, the silver is generally left in an atmosphere in which it will not undergo sulfurization.

Usually, when the glossiness of the surface of a light reflecting member such as a lead frame is increased, the reflectance of light is improved, and the luminance of the light emitting device can be improved by this reflected light. However, since the light reflection due to an increase in glossiness is specular reflection, bright, intense light is obtained on the entire central surface of the light emitting device, but the light is weaker around the edges, resulting in a light emitting device with high directivity and low intensity distribution. Although such a light-emitting device is suitable as a spotlight, it is not really suitable for outdoor advertising signs, light-emitting display signs, traffic lights, or the like, or for general lighting and the like. With a light emitting device such as this, more even light emission on the entire surface of the light emitting device can be achieved by disposing a light diffusing material where the light is emitted. On the other hand, light is absorbed by the light diffusing material, which leads to a decrease in light extraction efficiency, and it is more difficult to adjust the form and amount of this dispersion, so luminance or color variance occurs.

In view of this, as described above, luminance can be increased without increasing the glossiness, that is, a high overall luminous flux can be realized, and a lead frame, and then a light emitting device, with which light extraction efficiency can be markedly improved can be obtained, by selectively disposing two or more specific silver-containing layers. Also, a lead frame, a light emitting device, etc., with which these advantageous characteristics can be obtained with a relatively simple manufacturing apparatus and manufacturing process can be realized, without increasing the manufactured cost, by selectively combining these specific silver-containing layers. Therefore, it is also possible to provide a lead frame with which a light emitting device can be configured, without using a light diffusing material that makes it difficult to adjust the dispersion form, quantity, and so forth.

As will be described below, in addition to the base material and the two or more silver-containing layers, the lead frame may further include one or more other layers, such as an intermediate layer, an underlayer, or the like.

More specifically, as shown in FIG. 1A, the lead frame 1 may further have an underlayer 1$b$ stacked on a base material 1$a$, and an intermediate layer 1$c$ stacked on the underlayer 1$b$. The intermediate layer 1$c$ has, for example, a first intermediate layer 1$c$1, a second intermediate layer 1$c$2, and the like, with a lowermost layer among the two or more silver-containing layers in a silver-containing layer 1$d$ being stacked on the second intermediate layer 1$c$2. These layers may be stacked on one side of the base material 1$a$, but when the formation method of these layers is taken into account, it is preferable for these layers to be stacked on the entire surface of the base material 1$a$, that is, the entire upper and lower surfaces and side surfaces as shown in FIG. 1A.

In the present application, the lead frame reflects light emitted from the light emitting element and a wavelength conversion member (discussed below). The lead frame 1 may be in any form, so long as this reflection function can be manifested. For example, it may be provided under the light emitting element, or it may be provided in the form of a reflector surrounding the light emitting element. Also, with a flat lead frame, a wiring pattern may be formed on an insulated substrate, the result serving as a positive and negative conductive member that is electrically connected to the light emitting element, by wires or the like as needed. Furthermore, the lead frame 1 may also function as a mounting member on which the light emitting element is mounted, a heat dissipation member for dissipating heat, or a conductive member that is electrically connected to the light emitting element.

Silver-Containing Layer 1$d$

The sliver-containing layer 1$d$ includes two or more of silver-containing layers stacked on the surface of the lead frame 1. The two or more silver-containing layers of the silver-containing layer 1$d$ are formed of elemental silver, an alloy of silver and one or more elements selected from the group consisting of gold, platinum, rhodium, palladium, osmium, ruthenium, tin, indium, zinc, tellurium, etc. In the case of a silver alloy, the proportion of silver is preferably about 70% to 99% by weight.

The total thickness of the silver-containing layer 1$d$ is preferably about 0.05 µm to about 5.0 µm. It is preferable for the total thickness of the silver-containing layer 1$d$ to be 0.05 µm or more because the light reflectance will be high. In case where the total thickness of the silver-containing layer 1$d$ exceeds 5.0 µm, the amount of expensive silver to be used is too large to be cost effective, but there is no particular disadvantage in terms of the light emitting device. From the standpoint of minimum material cost, reliability of assembly, such as ease of wire bonding, and preventing sulfurization, the total thickness of the silver-containing layer 1$d$ is preferably about 0.1 µm to about 3.5 µm. In order to increase light reflectance, about 0.5 µm to about 3.5 µm is more preferable. Furthermore, in order to prevent the diffusion of elements and the like from the underlayers, etc., about 0.5 µm to about 3.0 µm is even more preferable.

Figure 1B:
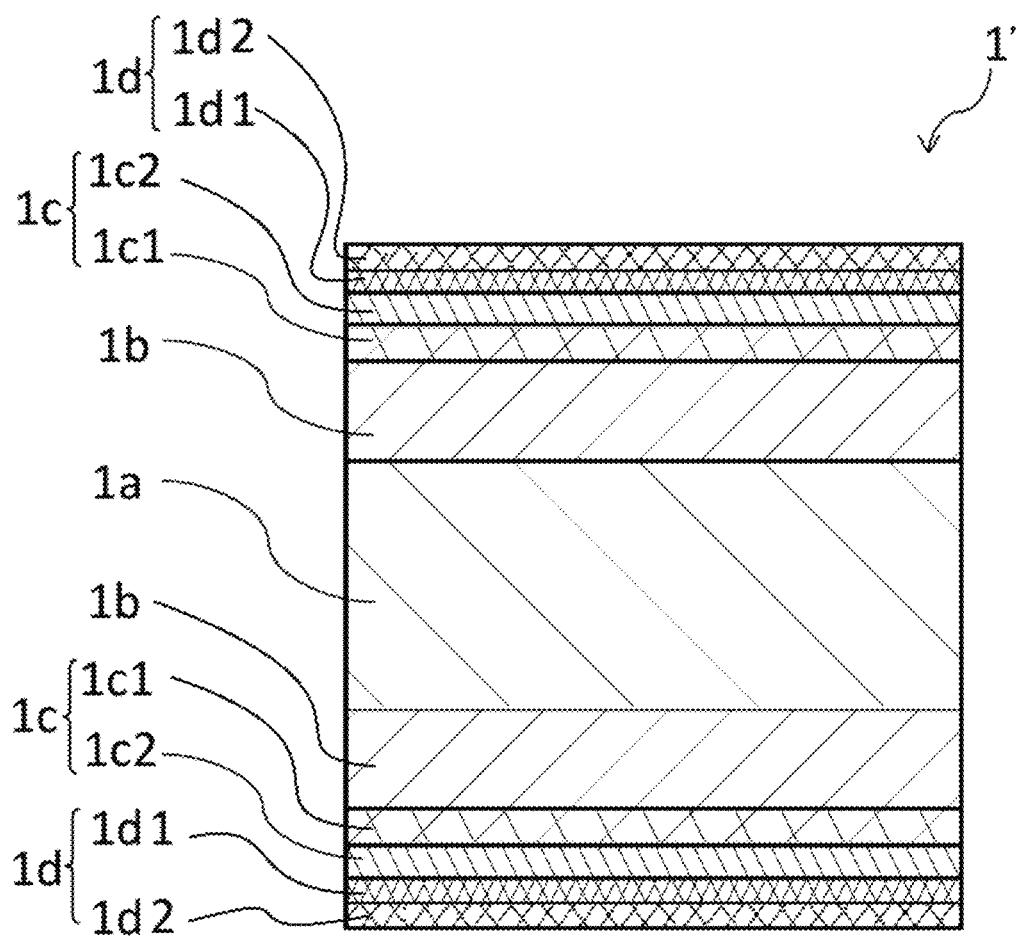
FIG. 1B is a partial enlarged schematic cross sectional view illustrating another embodiment of a lead frame.

Of the two or more silver-containing layers in the silver-containing layer 1$d$, the silver-containing layer 1$d$1 is a layer containing no selenium, or a silver-containing layer containing nothing (i.e., no substances) other than inevitable impurities, as shown in FIG. 1B. The concentration of elemental selenium in the silver-containing layer 1$d$1 layer is preferably about 0.01 ppm to 30 ppm by weight. In case where the silver-containing layers are produced by electroplating, for example, the inevitable impurities are salts such as cyanates, carbonates, or phosphates in the silver plating solution used for production; trace impurities such as carbon, nitrogen, oxygen, phosphorus, copper, or the like taken in from the copper and iron impurity salts; and compounds containing these elements. These impurities mean elements which are detected from measurements with a high-sensitivity mass spectrometer or the like from a silver-containing layer formed by ordinary electroplating. The silver-containing layer 1d1 may be a single layer, or two or more layers. The reason it is preferable not to include selenium is that when a silver-containing layer is produced by electroplating, a small amount of selenium additive is used in the silver plating solution, and it is hard to manage the selenium additive concentration precisely, making it extremely difficult to obtain a stable silver plating appearance.

Of the two or more silver-containing layers in the silver-containing layer 1d, the uppermost silver-containing layer 1d2 contains sulfur. The concentration of the elemental sulfur in the uppermost silver-containing layer is preferably 20 ppm to 250 ppm by weight, more preferably at least 50 ppm by weight, and even more preferably 200 ppm by weight or less. Within this range allows sufficient light reflectance to be obtained and the light extraction efficiency to be improved. At the same time, deterioration in the ease of die bonding, wire bonding, and the like in the mounting and assembly of the light emitting element can be prevented, for example, without lowering the purity of the film.

Sulfur in the uppermost silver-containing layer 1d2 is due to the fact that a brightening agent composed of an organic sulfur component in the plating solution is taken into part of the silver-containing layer when production is by electroplating. This brightening agent composed of an organic sulfur component can be procured, for example, as a commercially available plating solution in which the brightening agent is a sulfur-containing heterocyclic compound or a mercaptan compound.

The lead frame in this embodiment preferably has reflectance of at least 70%, and more preferably at least 80%, with respect to light with a wavelength in the visible light region. This improves the light extraction efficiency. One way to improve the light reflectance, as will be described below, is to use a base material 1a having a high degree of flatness.

From the standpoint of light distribution, it is preferable for the finish to be between lusterless and half luster. An example of the glossiness is from 0.3 to 1.4, with 0.6 to 1.2 being preferable. Setting the glossiness to within this range prevents the light extraction efficiency from being markedly decreased, and prevents deterioration in the spreading of the light distribution caused by an increase in specular reflection of light incident on the lead frame. The glossiness indicated here is a value obtained with light received perpendicularly at 45° irradiation using a microsurface color difference meter VSR 300A (made by Nippon Denshoku Industries Co., Ltd.). The glossiness can be adjusted by varying the ratio of the thickness of the uppermost silver-containing layer containing the sulfur component to the thickness of the lower silver-containing layers.

In the two or more silver-containing layers in the silver-containing layer 1d, the ratio of the thickness of the uppermost silver-containing layer 1d2 containing the sulfur component to the thickness of the lower silver-containing layer 1d1 is preferably such that {uppermost silver-containing layer 1d2}:{lower silver-containing layer 1d1}=1:1 to 1:99, such as 50%:50% to 1%:99% with respect to the total thickness (100%) of the silver-containing layer 1d. In case where the thickness of the uppermost silver-containing layer 1d2 containing the sulfur component is set to be from 1/99 to 1/2 of the total thickness of the silver-containing layer 1d, the spreading of the light distribution can be appropriately adjusted without reducing the light extraction efficiency, and without increasing the specular reflection of incident light too much.

The silver-containing layer 1d including the two or more silver-containing layers may need not be provided on the entire surface of the lead frame 1. That is, at least a part of the surface of the lead frame 1 may be covered by the silver-containing layer 1d.

Figure 2A:
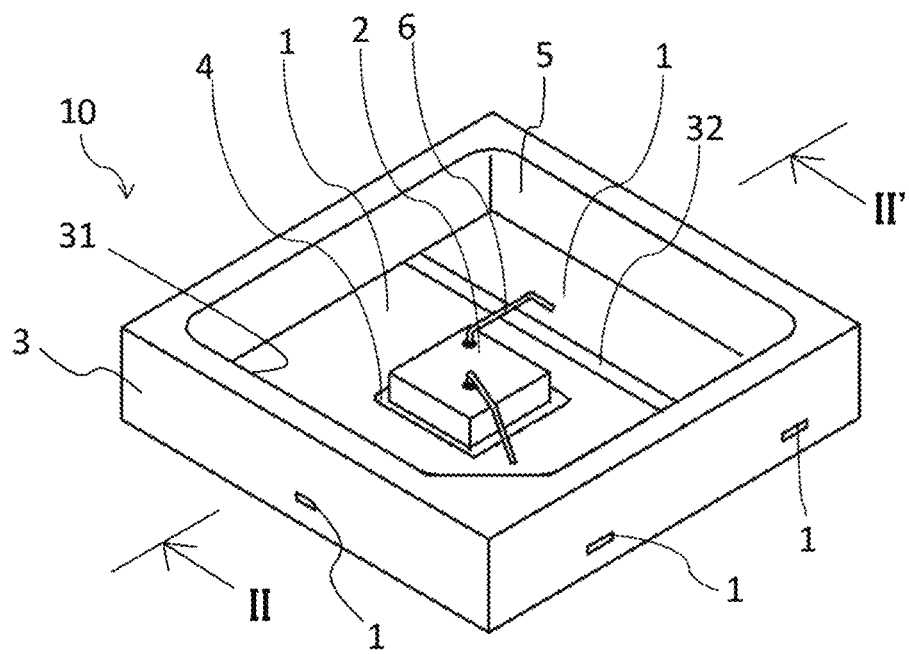
FIG. 2A is a schematic plan view for illustrating a light emitting device in an embodiment in which the lead frame in FIG. 1A is used.
Figure 3A:
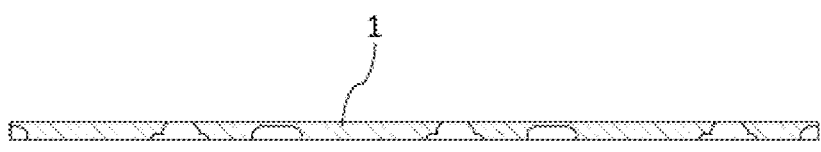
FIGS. 3A to 3D are schematic cross sectional step diagrams illustrating a method for manufacturing the light emitting device illustrated in FIG. 2A.

For example, in the package shown in FIGS. 2A and 3A, the silver-containing layer 1d may need not be provided to the part of the lead frame that is not exposed on the bottom surface of the concave portion of the resin molding (the substrate 3), that is, to sites that are embedded in the interior of the side walls of the resin molding, to the external terminals exposed to the outside of the resin molding, and to all or part of an element mounting site exposed on the bottom surface side of the resin molding.

For example, as shown in FIG. 1A, the silver-containing layer 1d may be provided on both the upper and lower surfaces of the lead frame 1, or may be provided to just one surface and not to the other surface. Also, it may be provided only partially on one surface. Also, the silver-containing layer 1d may have the same thickness everywhere, or its thickness may vary. More specifically, the silver-containing layer 1d may be provided on the upper and lower surfaces of the lead frame 1, and its thickness on one surface may be thicker than on the other surface. Providing a thicker silver-containing layer 1d to the portion near the light emitting element on the upper surface on which the light emitting element is mounted increases the light extraction efficiency. Thus varying the thickness reduces the amount of silver or other material and effectively reduces the material cost.

An example of a method for forming the silver-containing layer 1d on part of the lead frame 1 is a method in which a portion where the silver-containing layer 1d is not formed is protected with a mask, using a resist, a protective tape, or the like, when forming the silver-containing layer 1d.

Base Material 1a

The lead frame 1 has the base material 1a, on which the silver-containing layer 1d is stacked. The base material 1a is used as a material that determines the approximate shape of the lead frame 1.

Examples of the material of the base material 1a include copper, iron, and other such metals, alloys of these metals, and clad materials (such as a stacked body of Cu/FeNi/Cu). Copper and alloys thereof are particularly preferable from the standpoints of heat dissipation, mechanical characteristics, electrical characteristics, workability, and so forth. Also, a clad material helps keep the coefficient of linear expansion low, so the reliability of the light emitting device or the like can be improved.

The shape of the base material 1a can be appropriately selected depending on the application. For example, it may be in the form of a plate, a block, a film, etc., or may be in the form of a wiring pattern provided by printing or the like on a ceramic or the like, or a wiring pattern obtained by plating such a pattern with copper or an alloy thereof.

The thickness of the base material 1a can be set to the thickness that will be used for the lead frame, etc.

In order to increase the light reflectance of the lead frame 1, it is preferable for the base material 1a to have a high degree of flatness. For example, the surface roughness Ra of the base material 1a is preferably 0.5 μm or less. This increases the flatness of the underlayer 1b, the intermediate layer 1c, and the silver-containing layer 1d provided on the base material 1a, and allows the light reflectance of the lead frame 1 to be increased even though the thickness of the silver-containing layer 1d that reflects light is extremely thin, such as between 0.1 μm and 0.5 μm. The flatness of the base material 1a can be enhanced by performing treatments such as rolling, physical polishing, chemical polishing, or the like.

Underlayer 1b

As described above, the lead frame 1 may have the underlayer 1b in between the base material 1a and the silver-containing layer 1d.

The underlayer 1b can be formed from copper, nickel, NiCo, NiSn, NiP, or the like, for example. Of these, it is preferable to use copper or nickel because manufacture will be easier. Copper has the effect of reducing processing scratches and bumps on the base material even though the base material is a copper alloy, and a uniform silver-containing layer with no irregularities can be formed on the entire lead frame. A layer of nickel or an alloy thereof is effective as a diffusion barrier to the silver-containing layer in case where the base material is copper or a copper alloy.

The thickness of the underlayer 1b is preferably about 0.05 μm to about 10 μm, for example, and more preferably about 0.1 μm to about 5 μm. Keeping the thickness within this range effectively reduces irregularity of the base material 1a and effectively reduces the diffusion of metal elements such as copper into the silver-containing layer. In addition, raw materials and manufacturing costs can be reduced.

Intermediate Layer 1c

The lead frame 1 may have an intermediate layer 1c in between the base material 1a and the silver-containing layer 1d, and in particular between the underlayer 1b and the silver-containing layer 1d. The intermediate layer 1c may have a single-layer structure or a multi-layer structure. As shown in FIG. 1A, the intermediate layer c preferably has the first intermediate layer 1c and the second intermediate layer 1c2.

Examples of the intermediate layer 1c include a layer composed of one or more metals or metal compounds selected from the group including nickel, NiP, palladium, and gold.

The intermediate layer 1c, such as the second intermediate layer 1c2, provided directly under the silver-containing layer 1d is preferably a metal having good adhesion to silver and one that does not readily react with a sulfur component as compared to silver. More specifically, gold and gold alloys are preferable, with gold being more preferable. The intermediate layer 1c, such as the first intermediate layer 1c1, provided directly above the underlayer 1b is preferably palladium, a palladium alloy, or the like.

When a material containing copper is used as the base material 1a, it is preferable in case where an underlayer 1b that is nickel or an NiP alloy is provided on the base material 1a, and the first intermediate layer 1c1 (palladium or a palladium alloy) and the second intermediate layer 1c2 (gold) are stacked on the base material 1a in that order. With a configuration such as this, diffusion of the copper in the base material 1a into the silver-containing layer 1d can be suppressed, and the silver-containing layer 1d will have better adhesion and wire bonding property.

The intermediate layer 1c may be a layer that serves both to prevent sulfurization and to prevent diffusion. This reduces the cost entailed. For example, gold does not readily react with a sulfur component and has a good diffusion prevention effect, so it can be used to advantage.

Manufacture of Lead Frame 1

The underlayer 1b, the intermediate layer 1c, the silver-containing layer 1d, and the like can be formed by using any film formation method known in this field, so long as the above-mentioned configuration can be realized. However, a lead frame having a silver-containing layer used as the reflecting member of a light emitting device is generally such that both the portion where the light emitting element is mounted and the external terminal for joining to a mounting substrate or the like, that is, the outer lead portion, have a silver-containing layer, so it is preferable to form the layers sequentially by plating on the strip material shape, whether on the entire surface or just a portion.

The plating method may be electroplating, electroless plating, or the like. Electroplating is preferable because the layers can be formed very fast and mass productivity can be enhanced. It is more preferred for the layers to be formed by continuous plating by a so-called reel-to-reel method.

First, the base material 1a is provided, and preferably the base material 1a is pretreated. Examples of pretreatment include acid treatment with dilute sulfuric acid, dilute nitric acid, dilute hydrochloric acid, or the like, or alkali treatment with a commercially available degreasing agent or the like. Such treatment can be carried out one or more times, and the combination may include the same or different treatments. In case where the pretreatment is performed a plurality of times, it is preferable to wash with running water using pure water after each treatment. In case where the base material 1a is a metal plate made of copper or an alloy containing copper, dilute sulfuric acid is preferable, and in case where it is a metal plate made of iron or an alloy containing iron, dilute hydrochloric acid is preferable.

The underlayer 1b is formed on the base material 1a. In case where the underlayer 1b is formed from nickel or an NiP alloy, it can be formed using an NiP alloy plating solution.

The intermediate layer 1c can be formed using a plating solution for obtaining the desired material layer.

In case where the silver-containing layer 1d is formed by electroplating, glossiness can be improved by using combination of a plating solution to which no brightener has been added, and a selenium-based brightener, an antimony-based brightener, a sulfur-based brightener, an organic brightener, or the like. When many brighteners are used, components of these brighteners are incorporated into the silver-containing layer 1d, which may cause deterioration of corrosion resistance, but glossiness can be increased while reducing the use of brighteners by forming the intermediate layer 1c before the silver-containing layer 1d is formed by plating, and controlling the film quality thereof. As a result, it is possible to obtain a lead frame 1 having high glossiness and excellent corrosion resistance.

With a method involving continuous plating (reel-to-reel method), the lead frame is passed through a number of stages of an electrolytic treatment tank with an overflow length of about 1 meter and filled with a silver plating solution, for example. In case where the length of the electrolytic treatment tank is more than one meter long, it will be impossible for electrical current to reach the whole lead frame from the power supply portions at both ends of the electrolytic treatment tank due to the resistance of the lead frame material, and proper silver plating cannot be performed. Thus, in order to ensure a silver plating thickness of about 2 to 5 µm, it may be necessary to pass the material through a plurality of stages of the electrolytic treatment tank.

Figure 5A:
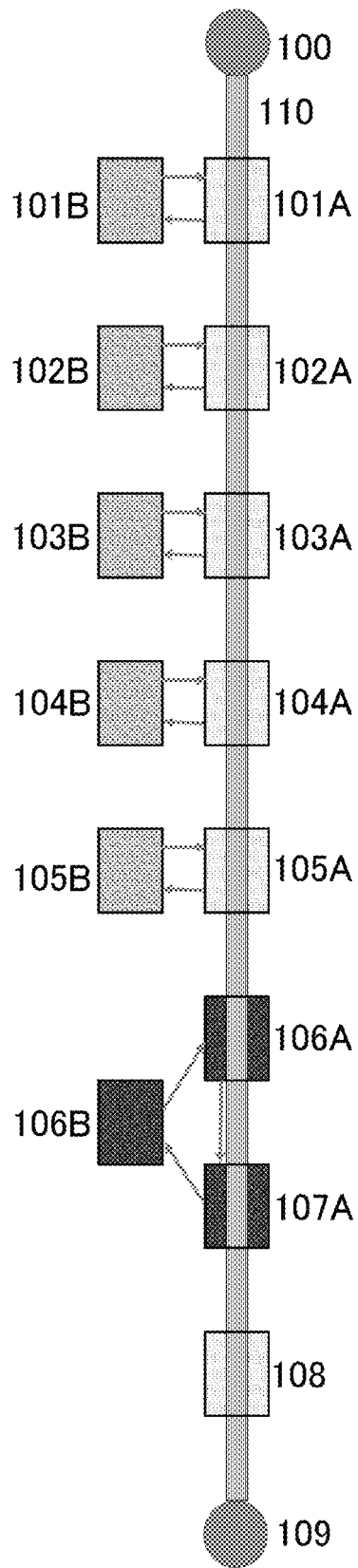
FIGS. 5A and 5B are step diagrams of a reel-to-reel plating apparatus, illustrating an embodiment of a lead frame having two or more silver-containing layers.
Figure 5B:
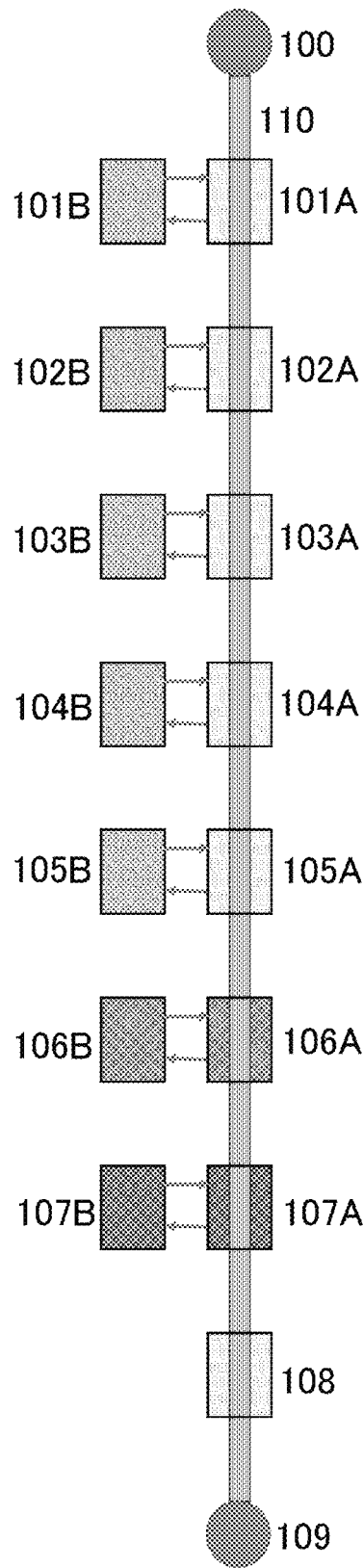

FIGS. 5A and 5B show an example of a treatment step diagram for the plating apparatus in the case of continuous plating. On the strip-shaped lead frame prior to plating, a plating layer is continuously produced by continuous treatment in the treatment tanks 101A, 102A, 103A, 104A, 105A from the pre-plating lead frame winding reel 100 in FIGS. 5A and 5B. Between each treatment tank may be two or three water rinsing tanks. Finally, after being dried by the hot air dryer 108, a silver-plated lead frame is completed and wound on the plated lead frame winding reel 109.

The pre-plating lead frame winding reel 100 goes through an alkaline electrolytic degreasing treatment tank 101A to remove oil stains and the like and obtain a clean base material 1a. In this alkaline electrolytic treatment tank, an alkaline electrolytic degreasing solution is pumped in from an alkaline electrolytic degreasing solution reserve tank 101B, and the lead frame is treated in an overflow tank and then returned to the alkaline electrolytic degreasing solution reserve tank 101B. Similarly, an acid neutralization treatment tank 102A, an underlayer 1b treatment tank 103A, an intermediate plating 1c1 treatment tank 104A, an intermediate plating 1c2 treatment tank 105A, a silver plating 1d1 treatment tank, and a silver plating 1d2 treatment tank perform plating in that order to complete the silver-plated lead frame.

With an ordinary continuous plating device, as shown in FIG. 5A, in case where silver plating solution is supplied from a single reserve tank 106B to two tanks, namely, a silver plating 1d1 treatment tank and a silver plating 1d2 treatment tank (electrolytic treatment tanks with a plurality of stages), the silver plating film thus obtained is, strictly speaking, a stacked structure, but it is difficult to observe any boundary line between films plated by the plating treatment tanks even when a cross section is observed by FIB-SEM, SEM-EBSD, or the like, so for general purposes the result may is considered to be a single-layer plating.

On the other hand, with a single continuous plating device, it is possible to form two types of silver-plated lead frame having different glossiness. Silver plating may be supplied from independent reserve tanks in order to form the stacked structure in this embodiment.

For example, as shown in FIG. 5B, a silver-plated lead frame can be produced using a device capable of supplying silver plating solution from a silver plating 1d1 solution reserve tank 106B and a silver plating 1d2 solution reserve tank 107B, which are independent from each other, to silver plating treatment tanks 106A and 107A. When this device is used to manufacture a silver-plated lead frame product with a glossiness of 0.8 and a silver-plated lead frame product with a glossiness of 1.2 with the same continuous plating device, silver plating is supplied from independent reserve tanks in which the concentration of the brightener in the silver plating solution supplied to a plurality of electrolytic treatment tanks varies from tank to the next. For example, when a silver-plated lead frame having a glossiness of 0.8 is produced, one stage of plating is performed in the silver plating treatment tank 106A that yields a glossiness of 0.8, after which the pump is stopped in the silver plating treatment tank 107A to stop the supply of the silver plating solution from the silver plating 1d2 liquid reserve tank 107B to the silver plating treatment tank 107A, so that only one step of plating is completed. On the other hand, when a silver-plated lead frame having a glossiness of 1.2 is produced, one stage of plating is performed in the silver plating treatment tank 106A that yields a glossiness of 0.8, after which a second stage of plating is performed in the silver plating treatment tank 107A that yields a glossiness of 1.6, thereby producing a silver-plated lead frame having a glossiness of 1.2. In this manner, a stacked silver-plated lead frame can be produced by continuously running silver plating treatment tanks with various silver plating solutions in which the concentration of the brightener or the type of brightener is varied and which consist of two or more stages. The plating device performing the treatment steps in FIGS. 5A and 5B is just an example, and the treatment tanks may be provided with a plurality of processing steps or may be reduced depending on the specifications of the lead frame to be manufactured. Also, the length of the treatment tank in each treatment step can be adjusted according to the specifications of the plating to be produced.

As a result of diligent research conducted with such a continuous plating device, for example, a silver plating layer obtained from an silver plating solution containing a sulfur brightening agent generally has a glossiness of at least 1.5 at a plating thickness of 1 µm or more, while the glossiness exceeds 1.8 at a plating thickness of 2 µm or more. A light emitting device that makes use of a lead frame having a silver plating layer with a high glossiness is a light emitting device with, so-called, a high total luminous flux, but since the silver plating layer is close to a mirror surface and results in specular reflection, it is necessary to adjust the light distribution characteristics by using a light diffusing material for general lighting applications. However, with a display such as an LED display board or another such application, when a plurality of light emitting devices using a light diffusing material are arranged, the dispersion state and/or the amount of the light diffusing material will vary from one light emitting device to the next, resulting in variance in the luminance and color among the arranged display panels, and this would not be a practical display device.

In contrast, in this embodiment, a silver-containing layer having a stacked structure formed from a silver plating solution containing sulfur as a brightener is used for the uppermost silver-containing layer, that is, of two or more silver-containing layers, the one with the lower glossiness is disposed on the lower layer side and the one containing sulfur is disposed as the uppermost silver containing layer, and as a result, a light emitting device with remarkably high light emission efficiency can be provided even those the glossiness is low.

Embodiment 2: Package

Figure 2B:
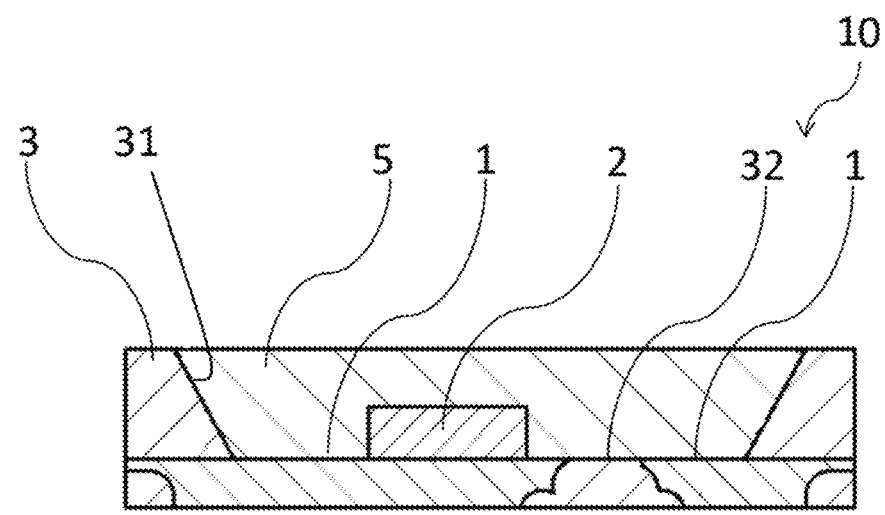
FIG. 2B is a schematic cross sectional view along II-II' line of the light emitting device in FIG. 2A.

As shown in FIGS. 2A and 2B, for example, the package in this embodiment has the above-mentioned lead frame 1 and a resin molding as the substrate 3. The resin molding is a member for supporting or holding the lead frame 1. The resin molding has a recessed part 31 on its upper surface, and the lead frame 1 is embedded in the bottom surface of the recessed part 31 so that the silver-containing layers of the pair of lead frames 1 are exposed.

With the lead frame 1, since the underlayer layer 1b is often more brittle than an ordinary metal layer, when the lead frame 1 equipped with the underlayer layer 1b is bent, there is a risk that the silver-containing layer 1d will break or crack. Consequently, there is a risk that the base material 1a of the lead frame 1 will undergo oxidation, sulfurization, or the like, which would compromise the reliability of the light emitting device.

However, as shown in FIGS. 2A and 2B, in case where the above-mentioned lead frame 1 has a substantially flat shape with no bent parts, reliability as a light reflecting material can be enhanced.

Substrate 3

The substrate 3 is a member that integrally holding the pair of lead frames 1.

The shape of the substrate 3 in plan view can be substantially square as shown in FIG. 2A. It may instead have a rectangular shape that is wider than it is long, some other quadrangular shape, a polygonal shape, or a combination of these.

The inner surfaces of the side walls of the recessed part 31 of the substrate 3 may be perpendicular to the bottom surface, or may be inclined as shown in FIGS. 2A and 2B, or may have a stepped surface. The depth of the recessed part 31, the shape of the opening, and the like can be appropriately adjusted according to the purpose and application. It is preferable to provide a light reflecting material on the inner surfaces of the recessed part 31, and in addition to exposing the lead frame 1 on the bottom surface, a light reflecting material may be provided on the inner surfaces of the side walls.

The substrate 3 can be formed from a thermosetting resin or a thermoplastic resin. Of these, the use of a thermosetting resin is preferred. The thermosetting resin is preferably a resin having lower gas permeability than the resin used for the sealing member (discussed below), and specific examples include epoxy resin compositions, silicone resin compositions, silicone-modified epoxy resins and other such modified epoxy resin compositions, epoxy-modified silicone resins and other such modified silicone resin compositions, polyimide resin compositions, modified polyimide resin compositions, urethane resins, and modified urethane resin compositions.

The substrate 3 preferably further contain microparticles of $TiO_2$, $SiO_2$, $Al_2O_3$, MgO, $MgCO_3$, $CaCO_3$, $Mg(OH)_2$, $Ca(OH)_2$, or the like as a filler to adjust the light transmissivity and to reflect about 60% or more of the light from the light emitting element, and more preferably reflect about 90%.

The substrate 3 may be formed from an inorganic material such as a ceramic, glass, or metal instead of a resin. This makes it possible to manufacture a highly reliable light emitting device with less deterioration, etc.

Embodiment 3: Package

Figure 4A:
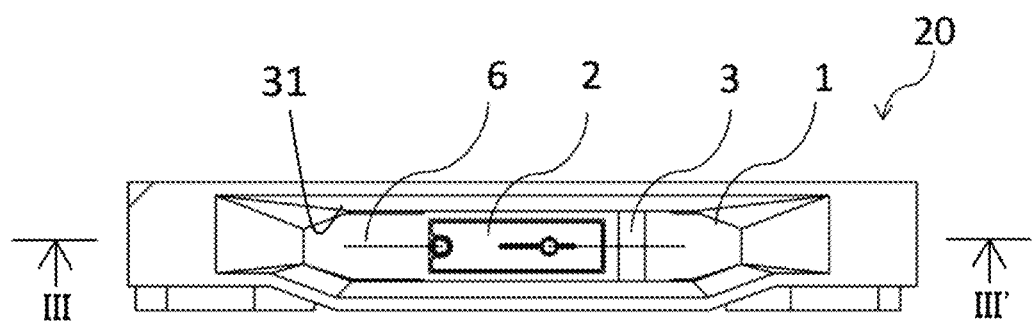
FIG. 4A is a schematic plan view illustrating the light emitting device in another embodiment.
Figure 4B:
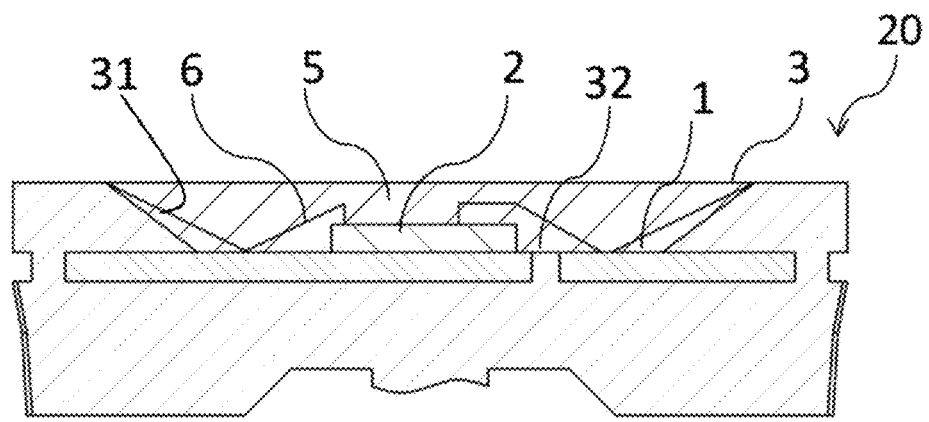
FIG. 4B is a schematic cross section view along III-III' line of the light emitting device in FIG. 4A.

As shown in FIGS. 4A and 4B, the package in this embodiment has, for example, the above-mentioned lead frame 1 and substrate 3. The substrate 3 is wider than it is long in plan view, and has a recessed part 31 that is wider than it is long on its upper surface. The lead frame 1 is embedded in the bottom surface of the recessed part 31 so that the silver-containing layers of the pair of lead frames 1 are exposed. The lead frame 1 partially protrudes outside the substrate 3 and bends toward the rear surface side opposite the upper surface and toward the lower surface side adjacent to the upper surface, conforming to the shape of the substrate 3, and constitutes an external terminal.

Embodiment 4: Light Emitting Device

As shown in FIGS. 2A and 2B, the light emitting device 10 in this embodiment has the above-mentioned package and a light emitting element 2 that is rectangular in plan view. The package has a recessed part 31 on the upper surface of the substrate 3, the silver-containing layers of the pair of lead frames 1 are exposed on the bottom surface of the recessed part 31, and a part of the lead frame 1 is embedded in the substrate 3. The light emitting element 2 is mounted on the upper surface of the exposed silver-containing layer. The upper surface of the exposed silver-containing layer reflects light emitted from the light emitting element 2 and a wavelength conversion member (discussed below). A sealing member 5 is sealed in the recessed part 31 in which the light emitting element 2 is mounted. The sealing member 5 is formed from a light-transmissive resin containing a phosphor.

The light emitting device of the above has high light reflectance regardless of the thickness of the silver-containing layer 1d of the lead frame 1. Therefore, the light emitting device with high light extraction efficiency can be obtained.

That is, the silver-containing layer or other such metal layer provided by plating on the base material and the underlayer is generally influenced by the plating crystal structure on the base material and the underlayer. In other words, when the base material and the underlayer have a crystal structure, the metal layer provided thereon is influenced by this crystal structure, and, so-called, epitaxial grows. On the other hand, it has been confirmed that the crystal structure resulting from the base material and the like adversely affects the light reflectance of the silver-containing layer, and particularly a silver-containing layer having a thickness of 1 μm or less. Therefore, in case where the underlayer 1b capable of reducing the influence of the crystal structure of the base material and so forth between the base material 1a and the silver-containing layer 1d, the silver-containing layer 1d provided by plating on the base material 1a can reduce or eliminate the influence from the crystal structure of the base material 1a. As a result, it is possible to form a silver-containing layer 1d that is dense, has few defects, has the fine crystalline structure inherent to silver, and has high light reflectivity. Consequently, even though the silver-containing layer 1d is thin, a lead frame 1 with high light reflectance can be obtained, and a light emitting device with high light extraction efficiency can be configured.

Light Emitting Element 2

The light emitting element 2 is provided at a position where the light emitted from the light emitting element 2 will be reflected by the lead frame 1. For example, as shown in FIGS. 2A and 2I, the light emitting element 2 is provided in a recessed part of the substrate 3 exposing the lead frame 1 on the bottom surface. That is, the light emitting element 2 is mounted on the lead frame 1. This improves the light extraction efficiency of the light emitting device 10.

The light emitting element 2 can be selected from among semiconductor light emitting elements with the desired wavelength. For example, nitride-based semiconductors such as InGaN, GaN, and AlGaN, and those in which GaP is used, can be used as light emitting elements 2 that emit blue and green light. GaAlAs, AlInGaP or the like can be used as red light emitting elements. Also, light emitting elements 2 composed of other materials may be used. The composition, emission color, size, number, and so forth of the light emitting elements 2 to be used can be appropriately selected according to the purpose.

In case where the light emitting device 10 includes a wavelength conversion member, a nitride semiconductor capable of emitting light with a wavelength short enough that this wavelength conversion member can be efficiently excited can be used to advantage. Various emission wavelengths can be selected depending on the material of the semiconductor layer and the mixed crystal ratio thereof. Also, the light emitting element 2 can output not only light in the visible band but also ultraviolet light or infrared light.

The light emitting element 2 has positive and negative electrodes. These positive and negative electrodes may both be provided on one side, or may be provided on the upper and lower surfaces of the light emitting element 2. The light emitting element 2 may be connected to the lead frame 1 by a bonding member 4 and a wire 6 (discussed below), or may be flip-chip mounted by a bonding member.

It is preferable for the light emitting element 2 to be mounted on the silver-containing layer 1d of the lead frame 1 because this improves light extraction efficiency.

In order to supply power to the light emitting element 2, the bonding member 4 may be electrically conductive and bonded to the electrodes of the light emitting element 2, or the wire 6 may be used. The wire 6 can also be connected so as to link the plurality of light emitting elements 2. Also, as shown in FIGS. 2A and 2B, each of the light emitting elements 2 may be connected to the lead frame 1.

Bonding Member 4

The bonding member 4 is a member for fixing and mounting the light emitting element 2 to the lead frame 1. A conductive bonding member 4 is preferable, examples of which include a paste of silver, gold, palladium, or the like, a eutectic solder material such as Au—Sn or Sn—Ag—Cu, a brazing material such as a metal with a low melting point, and particles or coatings of copper, silver, or gold. An insulating material may also be used as the bonding member 4. For example, an epoxy resin composition, a silicone resin composition, a polyimide resin composition, a modified version of these resins, a hybrid resin, or the like can be used. When one of these resins is used, in consideration of deterioration due to light and heat from the light emitting element 2, a metal layer, a dielectric reflection film, or the like having a high reflectivity, such as an aluminum film or a silver film, is preferably provided to the mounting surface of the light emitting element 2.

Sealing Member 5

The light emitting device 10 may has a sealing member 5. Providing the sealing member 5 so as to cover the light emitting element 2, the lead frame 1, the wire 6, and so forth protects the covered members from dust, moisture, external force, and the like, and enhances the reliability of the light emitting device.

The sealing member 5 is preferably light-transmissive, capable of transmitting light from the light emitting element 2, and has enough light resistance that it is not badly deteriorated by this light. Examples of specific materials include light-transmissive insulating resin compositions capable of transmitting the light from the light emitting element, such as silicone resin compositions, modified silicone resin compositions, modified epoxy resin compositions, and fluororesin compositions. Of these, a hybrid resin containing at least one kind of resin having a siloxane skeleton, such as dimethyl silicone, phenyl silicone having a low phenyl content, or a fluorine-based silicone resin, is preferable.

As to the method for forming the sealing member 5, in case where the sealing member 5 is a resin, potting (dripping), compression molding, printing, transfer molding, jet dispensing, spray coating, or the like can be used. In the case of a substrate 3 having the recessed part 31 as shown in FIGS. 2A and 2B, potting is preferable, and in case where a flat substrate 3 is used, compression molding or transfer molding is preferable.

As shown in FIGS. 2A and 2B, the sealing member 5 can be provided so as to fill in the recessed part 31 of the substrate 3.

The shape of the outer surface of the sealing member 5 can be variously selected according to the light distribution characteristics and the like sought for the light emitting device 10. For example, the directivity characteristics and the light extraction efficiency of the light emitting device can be adjusted by setting the upper surface to a convex lens shape, a concave lens shape, a Fresnel lens shape, a roughened surface, or the like.

The sealing member 5 may contain additives such as a wavelength conversion member, a colorant, a light diffusing agent, a light reflecting material, or various fillers, but from the standpoints of light absorption and the like, it is preferable for no additives to be contained other than a wavelength conversion member.

The wavelength conversion member is a material that converts the wavelength of the light from the light emitting element 2. When the light emitted from the light emitting element 2 is blue light, a yttrium-aluminum-garnet-based phosphor (hereinafter referred to as "YAG:Ce"), which is one type of aluminum oxide-based phosphor, can be used to advantage. A YAG:Ce phosphor emits yellow light that becomes a complementary color when some of the blue light from the light emitting element is absorbed, so a high-output light emitting device 100 that emits white mixed light can be formed relatively simply.

Examples of colorants include carbon black and the like. Examples of light diffusing agents include silica, titanium dioxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass and the like. Examples of light reflecting materials include titanium dioxide, silicon dioxide, zirconium dioxide, potassium titanate, alumina, aluminum nitride, boron nitride, mullite, niobium oxide, barium sulfate, various rare earth oxides (for example, yttrium oxide, gadolinium oxide) and the like. Examples of fillers include fibrous fillers such as glass fiber and wollastonite, and inorganic fillers such as carbon.

Wire 6

The wire 6 is a member for connecting the light emitting element 2 and the lead frame 1, etc. Metals such as gold, aluminum, and copper and alloys thereof can be used favorably as the material of the wire 6. It is also possible to use a core having on its surface a coating layer made of a different material, such as a copper core whose surface is provided with a coating layer of palladium or a PdAu alloy or the like. It is particularly preferable to select gold, silver, or a silver alloy, all of which offer high reliability. Of these, it is preferable to use silver or a silver alloy having high light reflectance. In this case, the wire 6 is preferably covered with a protective film. This prevents sulfurization and disconnection of the wire containing silver, and improves the reliability of the light emitting device.

In case where the base material 1a of the lead frame 1 is copper and the wire 6 is silver or a silver alloy, providing the underlayer 1b and the intermediate layer 1c in between them will suppress the formation of a local battery between the copper and the silver. This reduces the likelihood of deterioration of the lead frame 1 or the wire 6, and allows a highly reliable light emitting device to be obtained.

Protective Film

The light emitting device may further have a protective film. The protective film covers at least the silver-containing layer 1d provided on the surface of the lead frame 1, and is a member that mainly suppresses discoloration or corrosion of the silver-containing layer 1d on the surface of the lead frame 1. Furthermore, if desired, the surface of members other than the lead frame 1, such as the light emitting element 2, the bonding member 4, the wire 6, and the substrate 3 (resin molding), and the surface of the lead frame 1 not provided with the silver-containing layer 1d may also be covered.

The protective film is preferably formed by atomic layer deposition (ALD). With the ALD method, it is possible to form a very uniform protective film, and the protective film thus formed is denser than a protective film obtained by some other film formation method, so sulfurization of the silver-containing layer 1d can be prevented very effectively.

Examples of the material of the protective film include oxides such as $Al_2O_3$, $SiO_2$, $TiO_2$, $ZrO_2$, ZnO, $Nb_2O_5$, MgO, $In_2O_3$, $Ta_2O_5$, $HfO_2$, SeO, $Y_2O_3$, $SnO_2$, nitrides such as AlN, TiN, ZrN and fluorides such as $ZnF_2$, $SrF_2$. These may be used singly or in combination. The protective film may be a single layer or a stacked structure.

The light emitting device 10 can further have various members. For example, a Zener diode may be installed as a protective element.

Embodiment 5: Method for Manufacturing Light Emitting Device

In the light emitting device 10, the lead frame 1 has a flat shape without a bent part. This light emitting device 10 can be manufactured by the following manufacturing method.

First, as shown in FIG. 3A, a plurality of pairs of leads are formed by punching out a copper plate (the base material 1a).

Next, a step is formed at a specific position of the metal plate by wet etching. After the step is formed, the underlayer 1b, the intermediate layer 1c, and the silver-containing layers 1d1 and 1d2 are sequentially formed by plating on the surface of the base material 1a to form the lead frame 1.

Figure 3B:

As shown in FIG. 3B, a resin molding (the substrate 3) is formed by transfer molding on the lead frame 1 obtained in this manner. As shown in FIG. 3B, the resin molding is formed so that a pair of leads is exposed on the bottom surface of each recessed part 31.

Figure 3C:
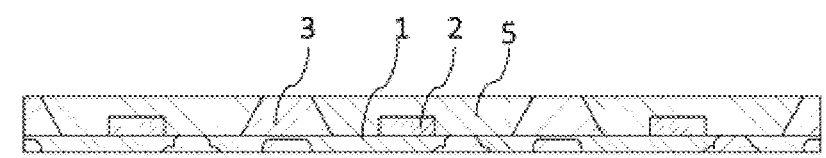

Then, as shown in FIG. 3C, the light emitting element 2 is mounted via a bonding member in the element mounting region of the lead frame 1 on which the substrate 3 is formed. The light emitting element 2 and the lead frame 1 are connected by wire. After this, the sealing member 5 is formed in each recessed part 31.

Figure 3D:
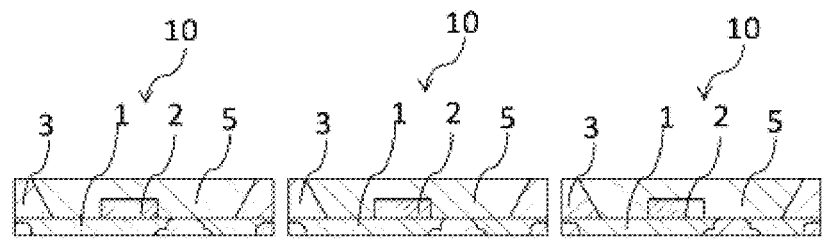

As shown in FIG. 3D, the lead frame 1 and the substrate 3 are cut using a dicing saw or the like, and are divided up into the individual light emitting devices 10, one of which is shown in FIGS. 2A and 2B. This cutting exposes a cross section of the lead frame 1 on the outer surface of the light emitting device 10. In this cross section, the base material 1a, the amorphous layer 1b, the underlayer 1c, and the silver-containing layer 1d are exposed.

This manufacturing method makes it possible to manufacture a light emitting device 10 having a flat lead frame 1 with no bent part.

Embodiment 6: Light-Emitting Device

As shown in FIGS. 4A and 4B, a light emitting device 20 in this embodiment includes a light emitting element 2 that is rectangular in plan view, a pair of flat lead frames having silver-containing layers on their surface, and a resin molding (the substrate 3) in which a part of the lead frame 1 is embedded.

The resin molding has a plan view shape that is wider than it is long, and has a recessed part 31 that is wider than it is long on its upper face. The lead frame 1 is embedded in the bottom surface of the recessed part 31 so that the silver-containing layers of the pair of lead frames 1 are exposed. The lead frame 1 partially protrudes outside the substrate 3 and bends toward the rear surface side opposite the upper surface and toward the lower surface side adjacent to the upper face, conforming to the shape of the substrate 3, to constitute an external terminal.

The sealing member 5 fills in the recessed part 31 of the resin molding so as to cover these members.

Examples of a pair of lead frames and a light emitting device in which they are used will be described in detail below.

Example 1

On the surface of a base material of copper is formed a copper layer having a thickness of 0.8 μm (as an underlayer), on this is formed a matte silver-containing layer (thickness: 0.1 μm) obtained from a silver plating solution containing no brightener (as a lower silver-containing layer), and on this is formed a silver-containing layer (thickness: 3.0 μm) obtained from a silver plating solution containing a sulfur brightener (as an upper silver-containing layer), the layers being formed by electroplating in the above order, thereby producing a pair of lead frames.

Examples 2 to 4

In the same manner as in Example 1, the layers shown in Table 1 were formed by electroplating to prepare a pair of lead frames.

Comparative Examples 1 to 4

In the same manner as in Example 1, the layers shown in Table 1 were formed by electroplating to prepare a pair of lead frames, but without forming the lower silver-containing layer.

TABLE 1

| Base material | Underlayer | Lower silver-containing layer | Uppermost silver-containing layer | Thickness ratio** |
|---|---|---|---|---|
| Examples | | | | |
| 1 Cu material | Cu plating 0.8 μm | Ag plating with no brightener, | Ag plating with sulfur-based | 7/93 |

TABLE 1-continued

| Base material | Underlayer | Lower silver-containing layer | Uppermost silver-containing layer | Thickness ratio** |
|---|---|---|---|---|
| | | 2.5 μm (plating time 60 s*) | brightener, 0.2 μm (plating time 6 s*) | |
| 2 Cu material | Cu plating 0.8 μm | Ag plating with no brightener, 2.0 μm (plating time 48 s*) | Ag plating with sulfur-based brightener, 0.6 μm (plating time 16 s*) | 38/62 |
| 3 Cu material | Cu plating 0.8 μm | Ag plating with no brightener, 1.5 μm (plating time 36 s*) | Ag plating with sulfur-based brightener, 0.8 μm (plating time 22 s*) | 43/57 |
| 4 Cu material | Cu plating 0.8 μm | Ag plating with selenium-based brightener, 1.5 μm (plating time 36 s*) | Ag plating with sulfur-based brightener, 0.8 μm (plating time 22 s*) | 35/65 |
| Comparative Examples | | | | |
| 1 Cu material | Cu plating 0.8 μm | none | Ag plating with selenium-based brightener, 2.5 μm | 0/100 |
| 2 Cu material | Cu plating 0.8 μm | none | Ag plating with selenium-based brightener, 2.5 μm | 0/100 |
| 3 Cu material | Cu plating 0.8 μm | none | Ag plating with selenium-based brightener, 2.5 μm | 0/100 |
| 4 Cu material | Cu plating 0.8 μm | none | Ag plating with selenium-based brightener, 2.5 μm | 0/100 |

*seconds
**Thickness of an uppermost silver-containing layer/thickness of a lower silver-containing layer The formation of the silver-containing layer in Examples was carried out as follows.

A copper-based lead frame was degreased with a commercially available alkaline electrolytic degreasing solution, after which it was acid-neutralized with 10% aqueous sulfuric acid. Copper plating was then performed with a copper plating solution having the following composition, at a bath temperature of 60° C., a current density of 4 A/dm², and a plating thickness of 0.8 μm.
Composition of copper plating solution:
Potassium copper cyanide=200 g/L
Potassium cyanide=25 g/L
Potassium carbonate=15 g/L After this, a silver strike thin-film was formed with a silver strike plating solution having the following composition, at a bath temperature of 25° C., a current density of 1.5 A/dm², and a plating time of 15 seconds.
Silver strike solution composition:
Potassium silver cyanide=1 g/L
Potassium cyanide=120 g/L
Potassium carbonate=15 g/L Next, in Example 1, a lower silver plating layer with a thickness of 2.5 μm was formed with a silver plating solution having the following composition, at a bath temperature of 50° C. and a current density of 4 A/dm².
Potassium silver cyanide=70 g/L
Potassium cyanide=120 g/L
Potassium carbonate=15 g/I.

The uppermost layer of silver plating was then formed with a silver plating solution having the following composition, at a bath temperature of 25° C. and a current density of 4 A/dm².
Potassium silver cyanide=70 g/L
Potassium cyanide=120 g/L
Potassium carbonate=15 g/L.
Commercial sulfur brightening agent=20 ml/L In Examples 2 and 3, lead frames were produced by varying just the plating thickness. Silver plating was performed with a silver plating solution having the following composition, at a bath temperature of 25° C. and a current density of 4 A/dm².
Potassium silver cyanide=70 g/L
Potassium cyanide=120 g/L
Potassium carbonate=15 g/L
Potassium selenocyanate=0.05 mg/L The uppermost layer of silver plating was then formed with a silver plating solution having the following composition, at a bath temperature of 25° C. and a current density of 4 A/dm².
Potassium silver cyanide=70 g/L
Potassium cyanide=120 g/L.
Potassium carbonate=15 g/L
Commercial sulfur brightening agent=20 ml/L In Comparative Examples 1 to 4, after forming the silver strike thin-film of Example 1, the uppermost layer was silver plated with a silver plating solution having the following composition at a bath temperature of 25° C. and a current density of 4 A/dm² and in a thickness of 2.5 μm.
Potassium silver cyanide=70 g/L
Potassium cyanide=120 g/L
Potassium carbonate=15 g/L
The potassium selenocyanate concentration was adjusted in order to obtain various degrees of glossiness.

Using the lead frames obtained in Examples 1 to 4 and Comparative Examples 1 to 4, light emitting devices having substantially the same structure as the light emitting device 20 shown in FIGS. 4A and 4B were manufactured, respectively. For each Example and Comparative Example, RGB light emitting elements were mounted as light emitting elements, and a light emitting elements that emit blue light were mounted with YAG phosphorus to provide light emitting devices that emits white mixed light.

The light emitting devices thus manufactured were each measured for blue radiant flux, green radiant flux, and red radiant flux. The light emitting devices that emits white mixed light were measured for total radiant flux. The results are shown in FIGS. 6 to 9.

Figure 6:
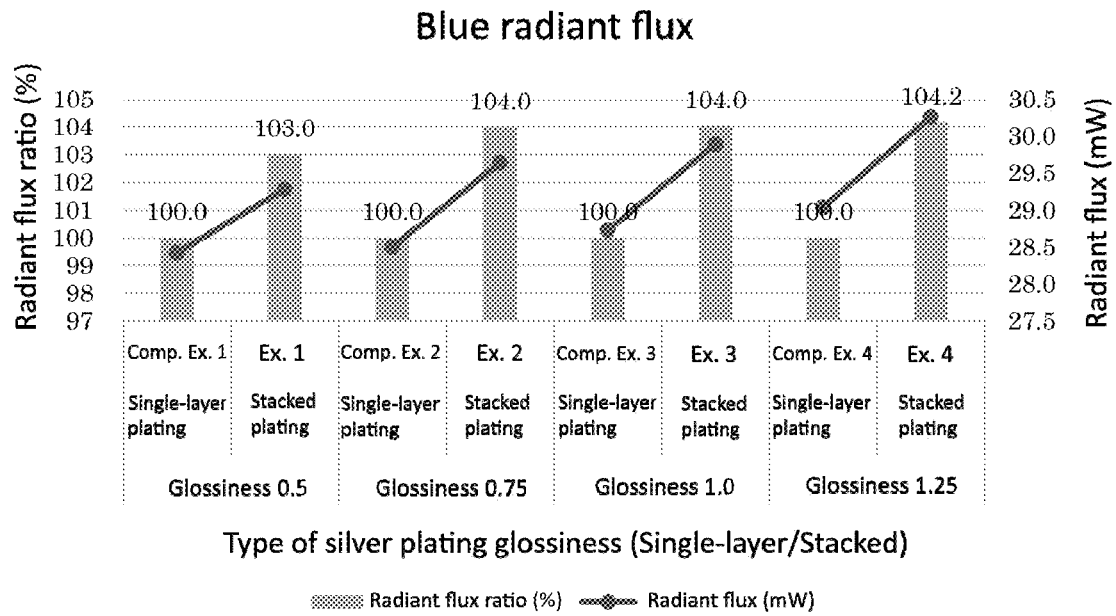
FIGS. 6 to 8 are graphs of the results of measuring the blue radiation flux, the green radiation flux, and the red radiation flux of a light emitting device in which the lead frame in FIG. 1A is used.
Figure 7:
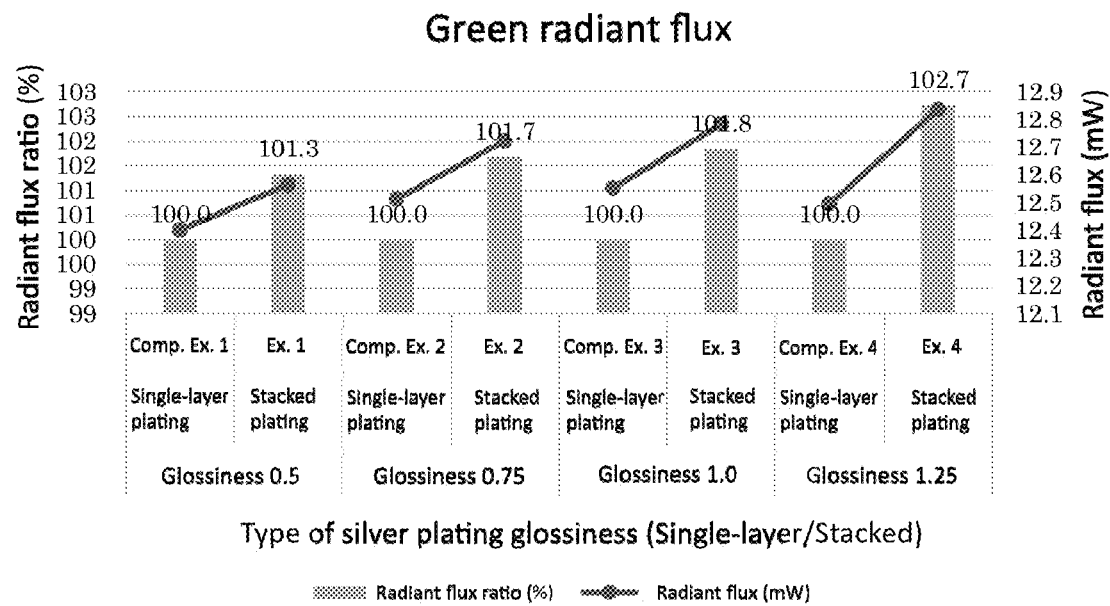
Figure 8:
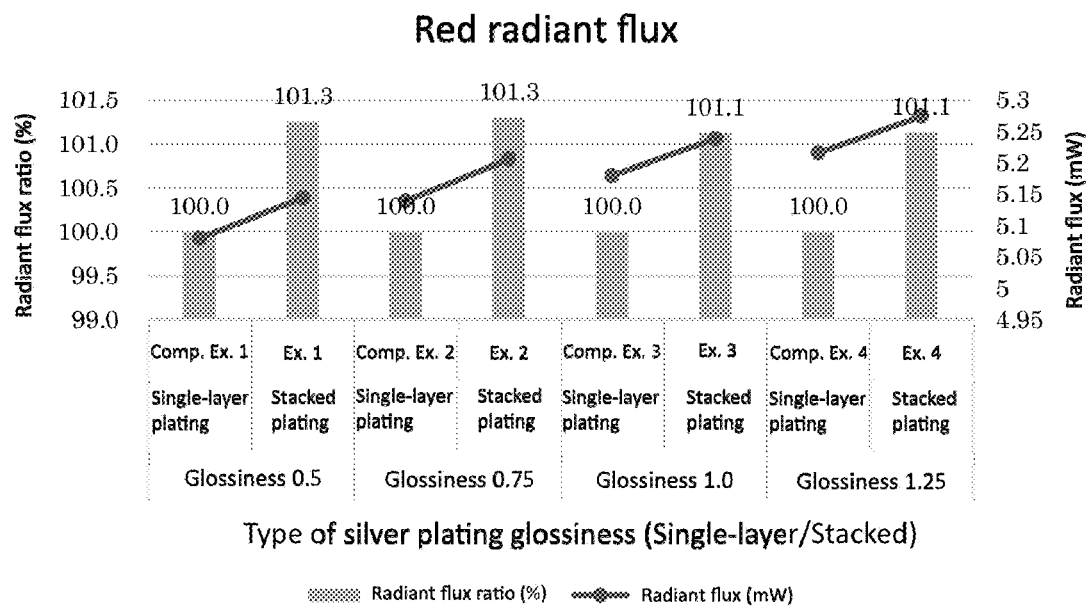
Figure 9:
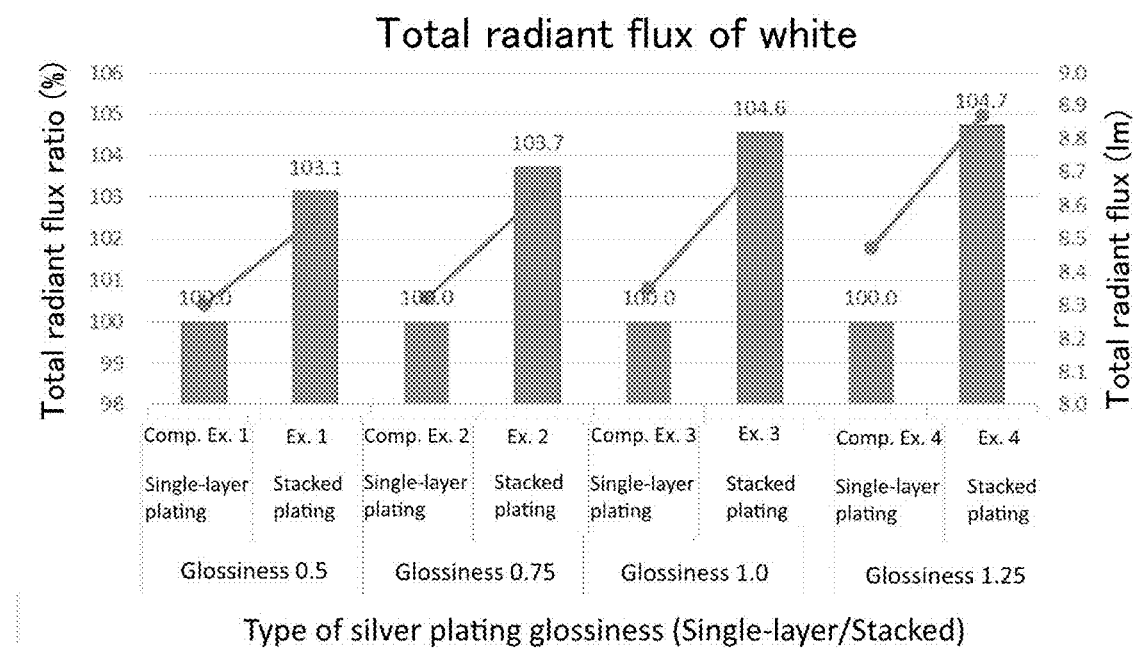
FIG. 9 is graph of the results of measuring the total radiation flux of a light emitting device that emits white light, in which the lead frame in FIG. 1A is used.

As can be seen from FIGS. 6 to 8, even though the glossiness is low, the light emitting devices of Examples 1 to 4 exhibit a high radiant flux for the blue, green, and red light emitting devices, and a high total radiant flux for the white light emitting devices, regardless of the thickness of the silver-containing layer. On the other hand, it was confirmed that with the light emitting devices in the comparative examples, a radiant flux or total radiant flux was obtained that was lower than that in the Examples having the same silver plating glossiness.

This tells us that in all of the above Examples, a light emitting device with high light extraction efficiency can be obtained while maintaining good light distribution.

What is claimed is:
1. A lead frame comprising:
a base material composed of a metal; and two or more silver-containing layers stacked on the base material, the two or more silver-containing layers including
an uppermost silver-containing layer containing organic sulfur, and
a lower silver-containing layer, with the lower silver-containing layer containing no selenium or the lower silver-containing layer being composed substantially only of silver.

2. The lead frame according to claim 1, wherein a concentration of elemental sulfur in the uppermost silver-containing layer is 20 ppm to 250 ppm by weight.

3. The lead frame according to claim 1, wherein a glossiness in the uppermost silver-containing layer is from 0.3 to 1.4.

4. The lead frame according to claim 1, wherein a total thickness of the two or more silver-containing layers is 0.05 μm to 5 μm, and a ratio of the uppermost silver-containing layer and the lower silver-containing layer is 1:1 to 1:99.

5. The lead frame according to claim 1, further comprising an underlayer in between the base material and the silver-containing layer.

6. The lead frame according to claim 5, wherein the underlayer includes a layer composed of one or more metals selected from the group consisting of copper, nickel, palladium and gold.

7. The lead frame according to claim 1, wherein the lead frame has a substantially flat shape with no bent parts.

8. A package comprising:
a substrate; and
the lead frame according to claim 1, embedded in the substrate with at least a part of the uppermost silver-containing layer being exposed from the substrate.

9. A light emitting device comprising:
the package according to claim 8; and
a light emitting element mounted on an upper surface of the uppermost silver-containing layer exposed from the substrate.

10. The light emitting device according to claim 9, further comprising
a wire connecting the light emitting element and the uppermost silver-containing layer, the wire being made of one of gold, silver, a silver alloy, copper, a copper core covered with palladium, and a copper core covered with palladium silver.

11. A method for manufacturing a light emitting device, comprising:
preparing a lead frame by
providing a base material,
forming an underlying metal on the base material by plating to form an underlayer, and
forming two or more silver-containing stacked layers on the underlayer, by forming one or more lower silver-containing layer, and by forming an uppermost silver-containing layer containing sulfur by using material containing at least silver and sulfur;
preparing a package including the lead frame; and
mounting a light emitting element on the package.

12. The method for manufacturing a light emitting device according to claim 11, wherein
the forming of the two or more silver-containing stacked layers is performed by electroplating.

13. The method for manufacturing a light emitting device according to claim 11, wherein
the providing of the base material includes forming the base material by rolling.

\* \* \* \* \*